(12) United States Patent
Motomatsu

(10) Patent No.: US 6,525,339 B2
(45) Date of Patent: Feb. 25, 2003

(54) ORGANIC ELECTROLUMINESCENT ELEMENT

(75) Inventor: Toshihiko Motomatsu, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/732,909

(22) Filed: Dec. 11, 2000

(65) Prior Publication Data

US 2001/0004113 A1 Jun. 21, 2001

(30) Foreign Application Priority Data

Dec. 16, 1999 (JP) .......................................... 11-357653

(51) Int. Cl.[7] .............................................. H01L 51/00
(52) U.S. Cl. .......................................... 257/40; 257/98
(58) Field of Search ............................ 257/40, 98–100; 513/504

(56) References Cited

U.S. PATENT DOCUMENTS 6,198,217 B1 * 3/2001 Suzuki et al. ................ 313/504

FOREIGN PATENT DOCUMENTS

| JP | 63-191599 | 12/1988 |
| JP | 6-231881 | 8/1994 |
| JP | 7-169567 | 7/1995 |
| JP | 7-211455 | 8/1995 |
| JP | 8-185980 | 7/1996 |
| JP | 9-185994 | 7/1997 |
| JP | 10-275680 | 10/1998 |
| JP | 10-275682 | 10/1998 |
| JP | 10-312883 | 11/1998 |

OTHER PUBLICATIONS

Japanese Office Action dated Aug. 20, 2002 with partial English translation.

* cited by examiner

Primary Examiner—Olik Chaudhuri
Assistant Examiner—Ginette Peralta
(74) Attorney, Agent, or Firm—McGinn & Gibb, PLLC

(57) ABSTRACT

An organic electroluminescent (EL) element has a sealed structure improved in humidity resistance. Subsequently deposited on a glass substrate of the organic EL element are components of the organic EL element, that is: a transparent electrode; an organic EL layer; and, a negative electrode. Further, the negative electrode is coated with a protection film on which a dehydrating agent is fixedly mounted using a porous sheet or a like. After that, the organic EL element has all the components sealed using a sealing member in an inert atmosphere to complete the sealed structure thereof.

25 Claims, 3 Drawing Sheets

US 6,525,339 B2

ORGANIC ELECTROLUMINESCENT ELEMENT

BACKGROUND OF THE INVENTION

1. Field of the Invention

The present invention relates to an organic electroluminescent (EL) element, and more particularly to such the organic EL element improved in its sealing structure.

The present application claims priority of Japanese Patent Application No. Hei 11-357653 filed on Dec. 16, 1999, which is hereby incorporated by reference.

2. Description of the Related Art

In a conventional organic EL element, in order to improve the organic EL element in brightness, the organic EL element has its negatibe electrode (cathode) made of a material such as alkali metals or a like which are excellent in electron injection properties. Further, as a material of its organic EL compound (medium) layer, the organic EL element employs a material excellent in light-emitting efficiency. However, such conventional organic EL element is still disadvantageous in that a so-called "dark spot" often appears in its display panel. This dark spot is constructed of an electroluminescence-disabled region resulting from deterioration in material properties of an organic EL medium and/or from exfoliation of the negative electrode. Such deterioration in material properties and such exfoliation of the negative electrode are caused by presence of oxygen or moisture in an atmosphere around the organic EL element to make the organic EL element poor in its light-emitting properties such as brightness, chromaticity and a like. Consequently, in order to improve the organic EL element in this respect, heretofore, various countermeasures have been taken against the dark spot.

For example, Japanese Patent Application Laid-open No. Hei 9-148066 discloses a method for decreasing humidity of the atmosphere around the organic EL element by using a dehydrating agent (drying agent) disposed in a sealed space provided inside the organic EL element. More specifically, in such the sealed space of the organic EL element, the dehydrating agent is oppositely disposed from the negative electrode so that the humidity of the atmosphere in the sealed space of the organic EL element is effectively decreased.

FIG. 5 is a cross-sectional view of the conventional organic EL element fabricated according to this prior art. As shown in FIG. 5, the conventional organic EL element has a construction in which: a transparent electrode (positive electrode, anode) 2 is made of a light-transmissive Indium-Tin Oxide (ITO), and formed on a glass substrate 1; and, subsequently formed on this transparent anode electrode 2 are an organic EL layer 3 and a negative electrode 4, wherein the organic EL layer 3 is constructed of a hole injection/transport layer, a light-emitting layer, an electron injection/transport layer or a like. In order to prevent the organic EL element from deteriorating in light-emitting properties, as shown in FIG. 5, a dehydrating agent 6 is fixedly mounted on an inner surface of a sealing member 7 in a space 8 defined by the sealing member 7, and serves as a drying agent therein.

On the other hand, Japanese Patent Application Laid-open No. Hei 7-169567 discloses a technique for preventing moisture from entering the organic EL element by using a protective layer. More specifically, such protective layer contains a dehydrating agent or any other materials suitable for absorbing or consuming oxygen and moisture, and is laminated to an outer surface of an assembly of a positive electrode, an organic EL layer and a negative electrode in the organic EL element.

Further, Japanese Patent Application Laid-open No. Hei 10-275682 discloses a method for preventing moisture from permeating a surface of the organic EL element by blocking out the moisture from the atmosphere. More specifically, in this conventional organic EL element: a protective layer, which is made of a fluorine-based high polymeric substance or of an oxide insulation material, is formed on a negative electrode of the organic EL element; and, further, a sealed space of this organic EL element is filled with an inert medium containing a dehydrating agent.

Now, the problems to be solved by the present invention will be described.

In the above-mentioned Japanese Patent Application Laid-open No. Hei 9-148066 in which the dehydrating agent 6 is oppositely disposed from the negative electrode 4, since an adhesive is used to fixedly mount the sealing member 7, considerable care should be taken not to damage the dehydrating agent, which complicates a fabrication process of the conventional organic EL element. Further, even this conventional organic EL element is still not free from the organic EL element deterioration problem caused by moisture, wherein the moisture enters the space 8 of the organic EL element through a contact area between the glass substrate 1 and the sealing member 7 bonded to this glass substrate 1, and adheres to a surface of the negative electrode 4 to deteriorate the organic EL element.

On the other hand, in the Japanese Patent Application Laid-open No. Hei 7-169567 in which the protective layer containing the dehydrating agent or any other material suitable for absorbing or consuming oxygen and moisture is laminated to the outer surface of the assembly of the positive electrode, the organic light-emitting material and the negative electrode, the protective layer is provided over a surface of the negative electrode. However, the dehydrating agent contained in the protective layer tends to absorb the moisture to gradually permit a leakage electric current to increase, which deteriorates the light-emitting properties of the conventional organic EL element.

Lastly, with respect to the Japanese Patent Application Laid-open No. Hei 10-275682 having a construction in which: the protective layer, which is made of a fluorine-based high polymeric substance or of the oxide insulation material, is formed on the negative electrode; and, the sealed space of this conventional organic EL element is filled with the inert medium containing the dehydrating agent in order to block the moisture from the atmosphere, it is hard to prepare the inert medium itself, and also hard to filling it in the sealed space of the organic EL element. In addition to the above disadvantages, this prior art is disadvantageous in that it is difficult to have the negative electrode brought into intimate contact with the protective layer, which permits the moisture of the atmosphere to enter the sealed space of the organic EL element through a boundary between the negative electrode and the protective layer.

SUMMARY OF THE INVENTION

In view of the above, it is an object of the present invention to provide an organic electroluminescent (EL) element, which is excellent in sealing properties thereof, and therefore capable of solving the above problems inherent in the prior arts.

According to a first aspect of the present invention, there is provided an organic electroluminescent element having its components arranged in a multi-layer stack in which the components include a positive electrode, an organic electro-luminescent layer and a negative electrode, and are subsequently deposited on a substrate, in which the organic electro-luminescent layer includes a hole injecting/transporting layer, a light-emitting layer, an electron transporting layer, wherein:

a protection film is formed on the negative electrode; a dehydrating agent is provided over the protection film; and all the components of the organic electroluminescent element are sealed by combining a sealing member with the substrate.

In the foregoing, a preferable mode is one wherein the dehydrating agent is made of a chemical compound capable of keeping its solid state even when taking up moisture, or made of a chemical compound capable of gelling when taking up moisture, and is formed into a powder or a film.

Also, a preferable mode is one wherein the dehydrating agent is coated with a porous sheet; and, an adhesive provided in an end portion of the porous sheet is used to bond the porous sheet to a surface of the protection film, whereby the dehydrating agent is fixedly mounted on the surface of the protection film.

Also, a preferable mode is one wherein the dehydrating agent is contained in a porous casing; an adhesive provided in an end portion of the porous casing is used to fixedly bond the dehydrating agent to a surface of the protection film.

Further, a preferable mode is one wherein a space defined and sealed by both the substrate and the sealing member is filled with an inert gas.

Also, according to a second aspect of the present invention, there is provided an organic electroluminescent element having its components arranged in a multi-layer stack in which the components include a positive electrode, an organic electroluminescent layer and a negative electrode, and are subsequently deposited on a substrate, in which the organic electroluminescent layer includes a hole injecting/transporting layer, a light-emitting layer, an electron transporting layer, wherein:

a composite protection film including a lower layer and an upper layer is formed in a manner such that the lower layer is disposed on the negative electrode and the upper layer is disposed on the lower layer; a dehydrating agent is provided over the composite protection film; and all the components of the organic electroluminescent element are sealed by combining a sealing member with the substrate.

In the foregoing second aspect, a preferable mode is one wherein the lower layer of the composite protection film is made of same chemical compound or its derivative used in the electron transporting layer.

A preferable mode is one wherein the upper layer of the composite protection film is made of a fluorine-based lubricant or of a diamond-like carbon.

Also, a preferable mode is one wherein a barrier metallic film is provided between the upper layer and the lower layer of the composite protection film.

Also, a preferable mode is one wherein a side surface of each of the negative electrode and the organic electroluminescent layer is coated with same material used in said upper layer of said composite protection film.

Also, a preferable mode is one wherein a side surface of each of the negative electrode, the barrier metallic film and the organic electroluminescent layer is coated with same material used in said upper layer of said composite protection film.

Also, a preferable mode is one wherein the dehydrating agent is made of a chemical compound capable of keeping its solid state even when taking up moisture, or made of a chemical compound capable of gelling when taking up moisture, and is formed into a powder or a film.

Also, a preferable mode is one wherein the dehydrating agent is coated with a porous sheet; and, an adhesive provided in an end portion of the porous sheet is used to bond the porous sheet to a surface of the upper layer of the composite protection film, whereby the dehydrating agent is fixedly mounted on the surface of the upper layer of the composite protection film.

Also, a preferable mode is one wherein the dehydrating agent is contained in a porous casing; an adhesive provided in an end portion of the porous casing is used to fixedly bond said dehydrating agent to a surface of the upper layer of the composite protection film.

Further, a preferable mode is one wherein the barrier metallic film is constructed of an aluminum film or of aluminum alloy film.

Still further, a preferable mode is one wherein a space defined and sealed by both the substrate and the sealing member is filled with an inert gas.

With the above configurations, it is possible to coat the negative electrode with the protection film, which makes it possible to directly fix the dehydrating agent to the protection film by using the porous sheet. This makes it possible to seal up the organic EL element of the present invention in an easy manner.

Also, the protection film is constructed of the composite film which includes: the lower layer made of the same material used in the electron transporting layer of the organic EL layer; and, the upper layer made of the fluorine-based lubricant and the like. Consequently, it is possible to have the negative electrode brought into more intimate contact with the protection film, which improves the sealed structure of the organic EL element of the present invention in humidity resistance and therefore in reliability.

Further, it is possible for additional provision of the barrier metallic film between the upper layer and the lower layer to further improve the sealed structure of the organic EL element of the present invention in humidity resistance.

BRIEF DESCRIPTION OF THE DRAWINGS

The above and other objects, advantages and features of the present invention will be more apparent from the following description taken in conjunction with the accompanying drawings in which.

DETAILED DESCRIPTION OF THE PREFERRED EMBODIMENTS

The best modes for carrying out the present invention will be described in detail using embodiments of the present invention with reference to the accompanying drawings.

First Embodiment

Figure 1:
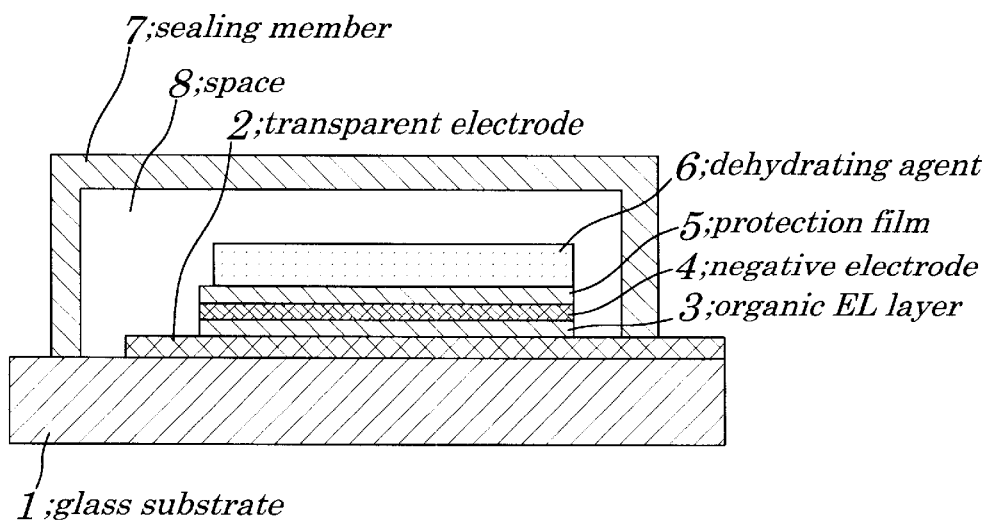
FIG. 1 is a cross-sectional view of a first embodiment of an organic EL element of the present invention.

In the accompanying drawings, FIG. 1 shows a cross-sectional view of a first embodiment of the organic EL element of the present invention. As shown in FIG. 1, this organic EL element has its transparent electrode (positive electrode, anode) 2 which is made of Indium-Tin Oxide (ITO) formed on a glass substrate 1.

Subsequently formed on this transparent electrode 2 in the following order are: an organic EL layer 3 such as a hole injecting/transporting layer, a light-emitting layer, an electron transporting layer and the like; and, a negative electrode 4. The organic EL element having the above construction is coated with a protection film 5, directly fixed to an upper surface of which protection film 5 is a dehydrating agent 6. This dehydrating agent 6 is formed into a powder or into a film.

The protection film 5 is made of a suitable material, for example such as: an organic compound and/or its derivatives used in the electron transporting layer of the organic EL layer 3; a fluorine-based lubricant such as perfluoropolyether or the like; or, a Diamond-Like Carbon (DLC) deposited at a low temperature by a chemical vapor deposition (CVD) process or by a sputtering process.

On the other hand, the dehydrating agent 6 is made of a suitable material, for example such as a chemical compound capable of keeping its solid state even when taking up moisture, or made of a chemical compound capable of gelling when taking up the moisture, and is formed into a powder or a film. This chemical compound maybe any one of barium oxide (BaO), calcium oxide (CaO), alumina ($Al_2O_3$), silica ($SiO_2$), calcium sulfate ($CaSO_4$), magnesium sulfate ($MgSO_4$), magnesium chlorate ($Mg(ClO_4)$), or like chemical compounds.

Figure 2A:
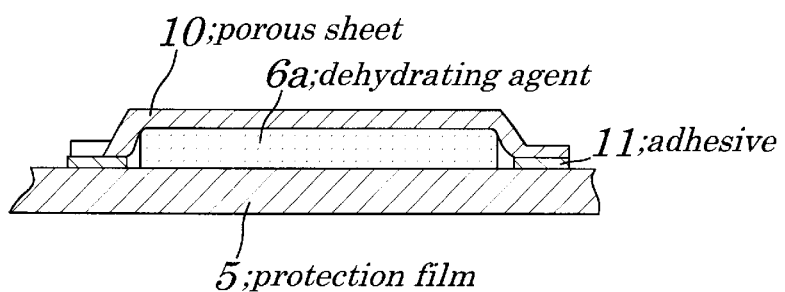
FIG. 2A is a cross-sectional view of a dehydrating agent used in the organic EL element shown in FIG. 1, illustrating a porous sheet for fixedly mounting the dehydrating agent.
Figure 2B:
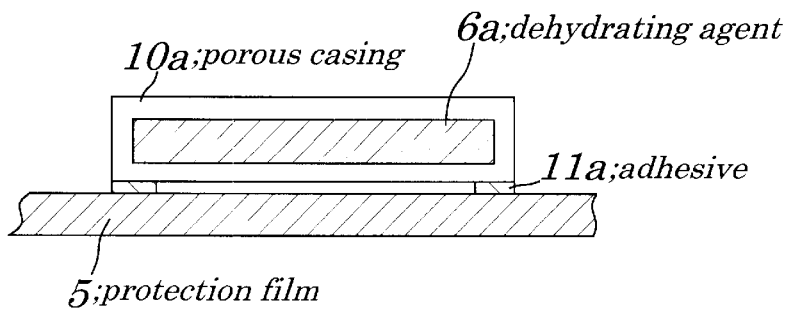
FIG. 2B is a cross-sectional view of the dehydrating agent used in the organic EL element shown in FIG. 1, illustrating a porous casing for fixedly mounting the dehydrating agent.

In a method for fixedly mounting the dehydrating agent 6 (shown in FIG. 1) on the protection film 5, as shown in FIG. 2A which illustrates a concrete example of this method: a dehydrating agent 6a is covered with a porous sheet 10 made of a polyethylene resin or of 4-fluoroethylene or like materials; and, the porous sheet 10 has its end portions fixed to an upper surface of the protection film 5 through a heat-resistant adhesive 11. Another concrete example of the method for fixedly mounting the dehydrating agent 6 (shown in FIG. 1) is shown in FIG. 2B, wherein: the dehydrating agent 6a is contained in a porous casing 10a; and, this porous casing 10a is fixedly mounted on an upper surface of the protection film 5 through a heat-resistant adhesive 11a.

Incidentally, the method for fixedly mounting the dehydrating agent 6 (shown in FIG. 1) on the protection film 5 is performed in an atmosphere of an inert gas, for example such as nitrogen gas, argon gas, or the like.

Lastly, as shown in FIG. 1, a sealing member 7 is bonded to the glass substrate 1 by using an epoxy resin adhesive of an ultraviolet-curing type (hereinafter referred to as "UV-curing type epoxy adhesive"), which is cured when subjected to radiation of ultraviolet rays. The interior of this first embodiment of the organic EL element (shown in FIG. 1) has its space 8 filed with an inert gas, for example such as nitrogen gas, argon gas, and the like. Incidentally, the transparent electrode 2 is brought into contact with the sealing member 7 through a contact area through which the transparent electrode 2 is bonded to the sealing member 7 by using the UV-curing type epoxy adhesive, so that the space 8 is sealed in the organic EL element.

Next, a method for fabricating the first embodiment of the organic EL element which is improved in its sealing structure will be described with reference to FIG. 1.

First, the glass substrate 1 of dimensions 5×5 $cm^2$ is prepared and sufficiently cleaned. Formed on the thus cleaned substrate 1 is the transparent electrode 2 made of ITO. After that, subsequently formed on this transparent electrode 2 are: the organic EL layer 3 such as the hole injecting/transporting layer, the light-emitting layer, the electron transporting layer, or the like; and, the negative electrode 4, so that the organic EL element of the first embodiment is produced.

Then, the protection film 5 of this organic EL element is formed on the negative electrode 4. This protection film 5 is constructed of an organic film made of the same material used in the electron transporting layer, wherein the organic film is deposited by a sputtering process to have a film thickness of approximately 100 nm.

Next, as shown in FIG. 2A, in an atmosphere of nitrogen gas, 20 mg of barium oxide is disposed on the protection film 5, serves as a dehydrating agent, and is fixedly mounted on the protection film 5 by using the porous sheet 10 made of the polyethylene resin or the like.

After that, in order to fill the nitrogen gas in the interior of the organic EL element of this first embodiment, the sealing member 7 is bonded to the glass substrate 1 by using the UV-curing type epoxy adhesive. In this bonding process, the UV-curing type epoxy adhesive is subjected to radiation of ultraviolet rays in a condition in which the sealing member 7 is pressed against the glass substrate 1, so that the UV-curing type epoxy adhesive is cured to seal the organic EL element.

A humidity resistance test of the organic EL element thus fabricated was conducted at a temperature of 50° C. in a humid environment having a relative humidity of 90%. As a result, any occurrence and any growth of the dark spot was not observed in this organic EL element, even after a lapse of 1000 hours.

Subsequently, a life test of the same organic EL element, to which a constant current was supplied to drive this organic EL element, was conducted. As a result, it was possible to obtain an initial level of 200 $cd/cm^2$ in brightness. At this time, such period of time as the level in brightness is reduced by half of its initial level was approximately 3000 hours.

A comparative example, that is, comparative organic EL element with respect to the first embodiment was prepared by: removing the protection film 5 from the organic EL element of the first embodiment; and, fixedly bonding the dehydrating agent 6 to the sealing member arranged over the negative electrode 4 by using an epoxy resin to seal the dehydrating agent 6.

The thus prepared comparative organic EL element was subjected to a humidity resistance test conducted at a temperature of 50° C. in a humid environment having a relative humidity of 90%. As a result, some occurrence and growth of the dark spot was observed in this comparative organic EL element after a lapse of 1000 hours. Subsequently, a life test of the same comparative organic EL element, to which a constant current was supplied to drive this comparative organic EL element, was conducted. As a result, such period of time as the level in brightness was reduced by half of its initial level was only approximately 1500 hours when the initial level in brightness was 200 cd/cm$^2$, which makes it difficult to use such comparative organic EL element in any form of display panels.

Second Embodiment

Now, a second embodiment of an organic EL element of the present invention will be described with reference to the drawings.

Figure 3A:
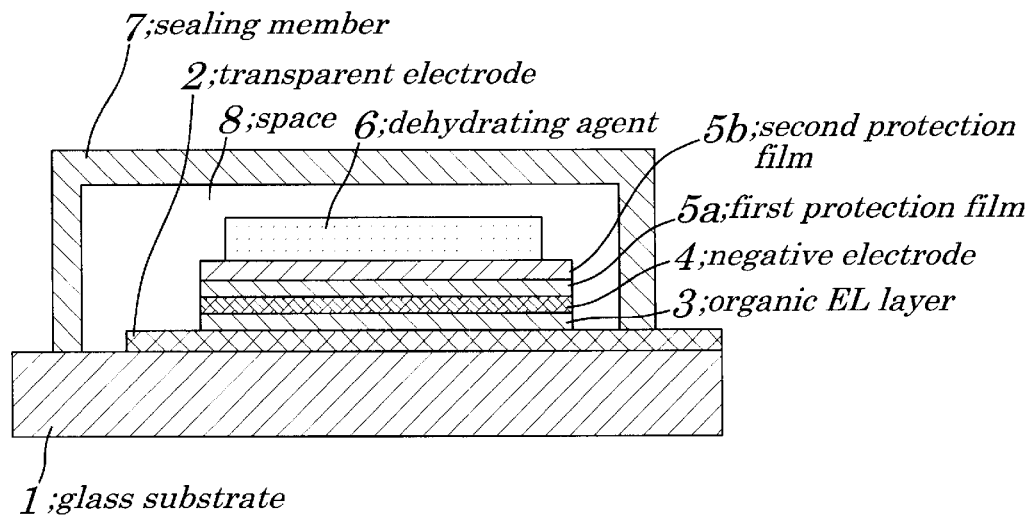
FIG. 3A is a cross-sectional view of a second embodiment of an organic EL element of the present invention.

FIG. 3A shows a cross-sectional view of the second embodiment. As shown in FIG. 3A, in the organic EL element of this second embodiment, as is in the first embodiment described above: the organic EL element has its transparent electrode 2 formed on a glass substrate 1, the transparent electrode 2 being made of ITO; and, subsequently formed on this transparent electrode 2 in the following order are: an organic EL layer 3 such as a hole injecting/transporting layer, a light-emitting layer, an electron transporting layer, or the like; and, the negative electrode 4. The organic EL element having the above construction is coated with a first protection film 5a which is made of a same material used in an organic compound of the electron transporting layer of the organic EL layer 3. The first protection film 5a is in turn coated with a second protection film 5b. Then, directly fixed to an upper surface of the second protection film 5b is a dehydrating agent 6 which is formed into a powder or into a film.

The first protection film 5a may use any organic compound as its material, provided that such organic compound is a same type of the organic compound used in the electron transporting layer of the organic EL layer 3. On the other hand, the second protection film 5b may be made of: a fluorine-based lubricant such as perfluoropolyether or the like; or, the DLC (diamond-like carbon) deposited at a low temperature by a CVD process or by a sputtering process.

Same type of the dehydrating agent 6 used in the first embodiment is also used in the second embodiment of the organic EL element. And same method for fixedly mounting the dehydrating agent 6 onto the protection film 5 used in the first embodiment is also used for fixedly mounting the dehydrating agent 6 onto the protection film 5b in the second embodiment of the organic EL element.

In the second embodiment, since a surface of the negative electrode 4 is coated with both the first protection film 5a and the second protection film 5b, the second embodiment can be more improved in humidity resistance than the first embodiment.

Figure 3B:
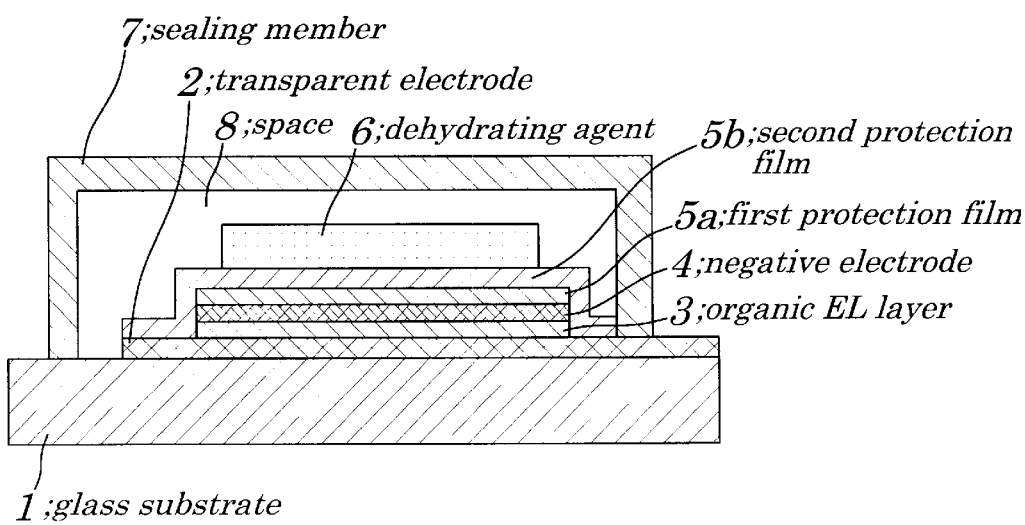
FIG. 3B is a cross-sectional view of a modification of the second embodiment shown in FIG. 3A, illustrating a second protection film covering a side surface of each of components of the organic EL element of the present invention.

On the other hand, FIG. 3B shows a cross-sectional view of a modification of this second embodiment. As shown in FIG. 3B, in this modification, the second protection film 5b covers a side surface of each of the organic EL layer 3 and the negative electrode 4, so that the humidity resistance of this modification (shown in FIG. 3B) of the second embodiment is more improved in humidity resistance than the second embodiment (shown in FIG. 3A).

Next, a method for fabricating the second embodiment of the organic EL element will be described with reference to FIG. 3A in detail.

First, the glass substrate 1 of dimensions 5×5 cm$^2$ is prepared and sufficiently cleaned. Then, the transparent electrode 2 made of ITO is formed on the glass substrate 1, and serves as a positive electrode. Subsequently formed on the transparent electrode 2 are: the organic EL layer 3 such as the hole injecting/transporting layer, the light-emitting layer, the electron transporting layer and the like; and, the negative electrode 4, so that the organic EL element is formed.

After that, an organic film having the same film thickness of approximately 100 nm as that of the electron transporting layer is continuously formed on the negative electrode 4 by a sputtering process, and serves as the first protection film 5a of this organic EL element. Then, the first protection film 5a is coated with the second protection film 5b. This second protection film 5b is made of perfluoropolyether, and formed by a spin coating process to have a film thickness of approximately 10 nm. Incidentally, the perfluoropolyether used in the above is formed into a 1 wt. % solution of perfluoropolyether having been mixed with a complete fluoride which is known by the trade name "Florinart FC-77" (produced by Sumitomo 3M Corp.).

Next, in an atmosphere of nitrogen gas, 20 mg of barium oxide serving as the dehydrating agent 6 is disposed on the second protection film 5b, and covered with porous sheet 10 (as shown in FIG. 2A) made of polyethylene resin, so that the dehydrating agent 6 is fixedly mounted on the second protection film 5b.

Further, in order to fill an interior of the organic EL element of this second embodiment with nitrogen gas, the sealing member 7 is bonded to the glass substrate 1 by using UV-curing type epoxy adhesive in an atmosphere of the nitrogen gas. At this time, curing of the UV-curing type epoxy adhesive is performed in a condition in which the sealing member 7 is pressed against the glass substrate 1 to ensure that the organic EL element is completely sealed.

Humidity resistance of the thus fabricated organic EL element of the second embodiment (shown in FIG. 3A) was tested.

In this test, even when the organic EL element was subjected to a temperature of 50° C. and to a relative humidity of 90%, any occurrence and any growth of the electroluminescence-disabled region (dark spot) was not recognized at all, even after a lapse of 1000 hours. Further, when life test of the same organic EL element was performed in a condition in which the organic EL element was connected with a constant electric current source and capable of providing a luminance of its initial level of 200 cd/cm$^2$ in brightness, a period of time in which the luminance of the organic EL element decreases in brightness to reach a half of its initial level of 200 cd/cm$^2$ was approximately 3200 hours.

Third Embodiment

Now, a third embodiment of the organic EL element of the present invention will be described with reference to the drawings.

Figure 4A:
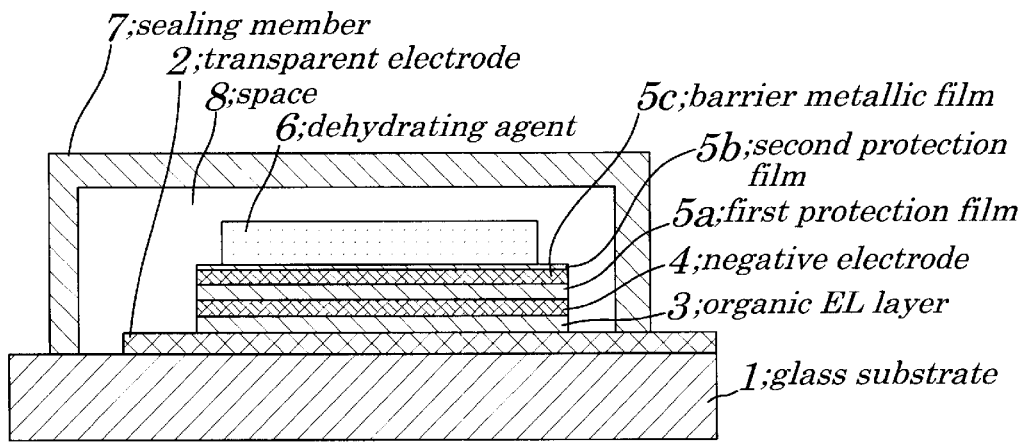
FIG. 4A is a cross-sectional view of a third embodiment of an organic EL element of the present invention.
Figure 4B:
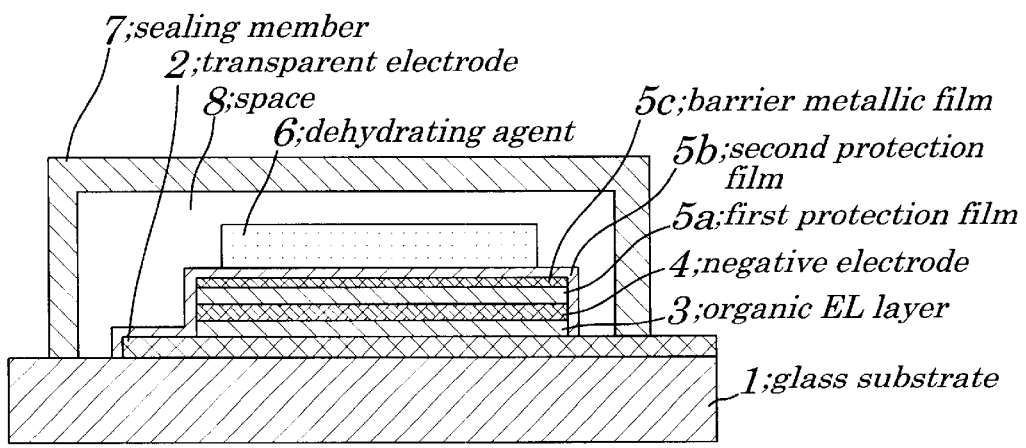
FIG. 4B is a cross-sectional view of a modification of the third embodiment shown in FIG. 4A, illustrating a second protection film covering a side surface of each of components of the organic EL element of the present invention.
Figure 5:
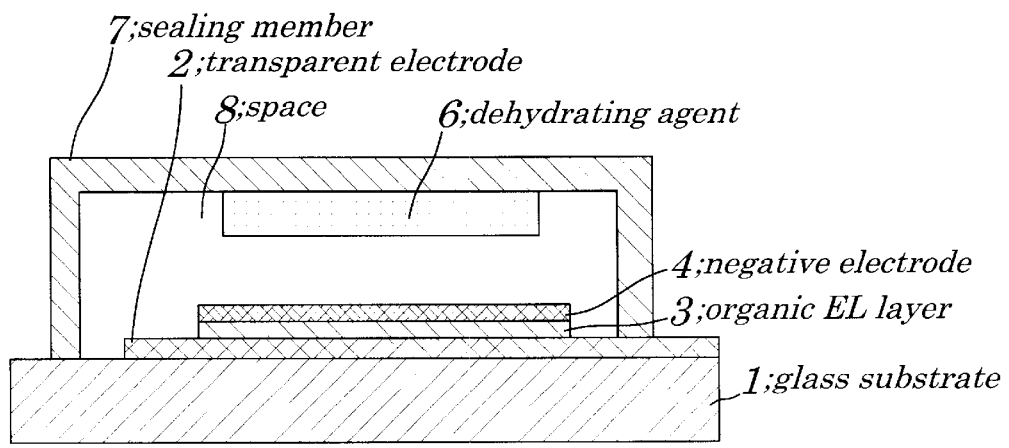
FIG. 5 is a cross-sectional view of a conventional organic EL element.

FIG. 4A shows a cross-sectional view of the third embodiment. On the other hand, FIG. 4B shows a cross-sectional view of a modification of the third embodiment shown in FIG. 3A, illustrating a second protection film covering a side surface of each of components of the third embodiment of the organic EL element. As is in each of the first embodiment and the second embodiment described above, in the third embodiment (shown in FIG. 4A): a negative electrode 4 is coated with the first protection film 5a which is made of a same organic compound used in an electron transporting layer of an organic EL layer 3; and, a barrier metallic film 5c is vapor-deposited on the first protection film 5a under vacuum. Further, this barrier metallic film 5c is in turn coated with a second protection film 5b. Directly fixed to an upper surface of this second protection film 5b is a dehydrating agent 6 which is formed into a powder or into a film.

Each of the first protection film 5a, the second protection film 5b and the dehydrating agent 6 is made of the same material as that used in the second embodiment. On the other hand, the barrier metallic film 5c may be made of aluminum or of an aluminum alloy. In function, this barrier metallic film 5c catches any moisture having passed through the second protection film 5b, and prevents such moisture from reaching any layer disposed under the barrier metallic film 5c inside the organic EL element of the third embodiment.

After that, a space 8 of the interior of the third embodiment is filled with inert gas. Lastly, a sealing member 7 is bonded to the glass substrate 1 by using UV-curing type epoxy adhesive to seal an interior of the organic EL element. Incidentally, an transparent electrode 2 having being brought into contact with the sealing member 7 through its contact portion has this contact portion bonded to the sealing member 7 by using the UV-curing type epoxy adhesive to complete the sealing of the organic EL element of the third embodiment.

In this third embodiment (shown in FIG. 4A), provision of the barrier metallic film 5c disposed between the first protection film 5a and the second protection film 5b makes it possible to more improve the organic EL element of the third embodiment in humidity resistance more than the organic EL element of each of the first and the second embodiment.

Next, with reference to FIG. 4A, a method for fabricating the third embodiment of the organic EL element will be described in detail.

First, as is in each of the first embodiment and the second embodiment, in this third embodiment, the glass substrate 1 of dimensions 5×5 cm² is prepared and sufficiently cleaned. Formed on the thus cleaned glass substrate 1 is the transparent electrode 2 made of ITO. Then, subsequently formed on this transparent electrode 2 are: the organic EL layer 3 such as the hole injecting/transporting layer, the light-emitting layer, the electron transporting layer, or the like; and, the negative electrode 4, so that the organic EL element is produced.

After that, the first protection film 5a of this organic EL element is formed on the negative electrode 4. This protection film 5a is constructed of an organic film made of the same material used in the electron transporting layer, wherein the organic film is deposited by a sputtering process to have a film thickness of approximately 100 nm. Then, 20 mg of aluminum is disposed on the first protection film 5a under vacuum to serve as the barrier metallic film 5c. Further, this barrier metallic film 5c is coated with the second protection film 5b. This second protection film 5b is made of perfluoropolyether, and formed by a spin coating process to have a film thickness of approximately 10 nm.

Next, in the atmosphere of the nitrogen gas, 20 mg of barium oxide serving as the dehydrating agent 6 is disposed on the second protection film 5b, and fixedly mounted on the same second protection film 5b by using the porous sheet 10 (as shown in FIG. 2A) made of polyethylene resin. In addition, in order to fill the nitrogen gas in the interior of the organic EL element, the sealing member 7 is bonded to the glass substrate 1 in the atmosphere of the nitrogen gas by using the UV-curing type epoxy adhesive which is subjected to radiation of ultraviolet rays and cured in a condition in which the sealing member 7 is pressed against the glass substrate 1, so that the organic EL element of the third embodiment has its interior completely sealed.

Incidentally, FIG. 4B shows a modification of this third embodiment (shown in FIG. 4A). In this modification, a side surface of each of the organic EL layer 3, the negative electrode 4, the first protection film 5a and the barrier metallic film 5c is coated with the second protection film 5b, so that the organic EL element of this modification (shown in FIG. 4B) is more improved in humidity resistance than the third embodiment (shown in FIG. 4A).

Humidity resistance of the organic EL element (shown in FIG. 4A) was tested. In this test, even when the organic EL element was subjected to a temperature of 50° C. and to a relative humidity of 90%, any occurrence and any growth of the dark spot was not recognized at all, even after a lapse of 1000 hours. Further, when a life test of the same organic EL element was performed in a condition in which the organic EL element was connected with a constant electric current source and capable of providing a luminance of its initial level of 200 cd/cm² in brightness, a period of time in which the luminance of the organic EL element-decreases in brightness to reach a half of its initial level of 200 cd/cm² was approximately 3500 hours, which ensures that the third embodiment (shown in FIG. 4A) is superior in humidity resistance to both the first embodiment and the second embodiment of the organic EL element.

It is apparent that the present invention is not limited to the above embodiments but may be changed and modified without departing from the scope and spirit of the invention.

What is claimed is:

1. An organic electroluminescent element comprising:
    a positive electrode formed on a substrate;
    an organic electroluminescent layer formed on said positive electrode, said organic electroluminescent layer comprising a hole injecting/transporting layer, a light-emitting layer, and an electron transporting layer;
    a negative electrode formed on said organic electroluminescent layer;
    a protection film formed on said negative electrode; and
    a dehydrating agent which is secured to said protection film by a porous material.

2. The organic electroluminescent element according to claim 1, wherein said dehydrating agent comprises one of a chemical compound capable of keeping its solid state when taking up moisture, and a chemical compound capable of gelling when taking up moisture.

3. The organic electroluminescent element according to claim 1, further comprising:
    a sealing member surrounding said organic electroluminescent element and secured to said substrate,
    wherein a space defined and sealed by said substrate and said sealing member is filled with an inert gas.

4. The organic electroluminscent element according to claim 1, wherein said negative electrode is coated with said protection film in order to directly fix said dehydrating agent to said protection film by using said porous sheet.

5. The organic electroluminscent element according to claim 1, wherein said dehydrating agent is directly fixed to an upper surface of said protection film.

6. The organic electroluminscent element according to claim 1, wherein said dehydrating agent comprises one of barium oxide (BaO), calcium oxide (CaO), alumina, silica ($Al_2O_3$), calcium sulfate ($CaSO_4$), magnesium sulfate ($MgSO_4$) and magnesium chlorate ($Mg(ClO_4)$).

7. The organic electroluminscent element according to claim 1, wherein said porous material comprises one of a polyethylene resin and 4-fluoroethylene.

8. The organic electroluminscent element according to claim 1, wherein said porous material comprises a porous sheet which covers an upper portion of said dehydrating agent.

9. The organic electroluminscent element according to claim 1, wherein said porous material comprises a porous casing which surrounds said dehydrating agent.

10. The organic electroluminscent element according to claim 1, further comprising an adhesive for securing said porous material to said protection film.

11. The organic electroluminsecent element according to claim 10, wherein said adhesive is comprised of a heat-resistant material.

12. The organic electroluminescent element according to claim 2, wherein said chemical compound is formed into at least one of a powder and a film.

13. An organic electroluminescent element having its components arranged in a multi-layer stack in which said components comprise a positive electrode, an organic electroluminescent layer and a negative electrode, and are subsequently deposited on a substrate, and wherein said organic electroluminescent layer includes a hole injecting/transporting layer, a light-emitting layer, an electron transporting layer, wherein a protection film is formed on said negative electrode, a dehydrating agent with a porous surface having an adhesive portion is directly fixed to a surface of said protection film, and all said components of said organic electroluminescent element are sealed by combining a sealing member with said substrate, and wherein said dehydrating agent is coated which a porous sheet, and, an adhesive provided in an end portion of said porous sheet is used to bond said porous sheet to a surface of said protection film, whereby said dehydrating agent is fixedly mounted on said surface of said protection film.

14. An organic electroluminescent element having its components arranged in a multi-layer stack in which said components comprise a positive electrode, an organic electroluminescent layer and a negative electrode, and are subsequently deposited on a substrate, and wherein said organic electroluminescent layer includes a hole injecting/transporting layer, a light-emitting layer, an electron transporting layer, and wherein a protection film is formed on said negative electrode, a dehydrating agent with a porous surface having an adhesive portion is directly fixed to a surface of said protection film, and all said components of said organic electroluminescent element are sealed by combining a sealing member with said substrate, and wherein said dehydrating agent is contained in a porous casing, and adhesive provided in an end portion of said porous casing is used to fixedly bond said dehydrating agent to a surface of said protection film.

15. An organic electroluminescent element having its components arranged in a multi-layer stack in which said components comprise a positive electrode, an organic electroluminescent layer and a negative electrode, and are subsequently deposited on a substrate, wherein said organic electroluminescent layer includes a hole injecting/transporting layer, a light-emitting layer, an electron transporting layer, wherein:

a composite protection film comprising a lower layer and an upper layer is formed in a manner such that said lower layer is disposed on said negative electrode and said upper layer is disposed on said lower layer;

a dehydrating agent is provided over said composite protection film; and all said components of said organic electroluminescent element are sealed by combining a sealing member with said substrate.

16. The organic electroluminescent element according to claim 15, wherein said lower layer of said composite protection film is made of same chemical compound or its derivative used in said electron transporting layer.

17. The organic electroluminescent element according to claim 15, wherein said upper layer of said composite protection film is made of a fluorine-based lubricant or of a diamond-like carbon.

18. The organic electroluminescent element according to claim 15, wherein a barrier metallic film is provided between said upper layer and said lower layer of said composite protection film.

19. The organic electroluminescent element according to claim 15, wherein a side surface of each of said negative electrode and said organic electroluminescent layer is coated with same material used in said upper layer of said composite protection film.

20. The organic electroluminescent element according to claim 18, wherein a side surface of each of said negative electrode, said barrier metallic film and said organic electroluminescent layer is coated with same material used in said upper layer of said composite protection film.

21. The organic electroluminescent element according to claim 15, wherein said dehydrating agent is made of a chemical compound capable of keeping its solid state even when taking up moisture, or made of a chemical compound capable of gelling when taking up moisture, and is formed into a powder or a film.

22. The organic electroluminescent element according to claim 15, wherein said dehydrating agent is coated with a porous sheet; and, an adhesive provided in an end portion of said porous sheet is used to bond said porous sheet to a surface of said upper layer of said composite protection film, whereby said dehydrating agent is fixedly mounted on said surface of said upper layer of said composite protection film.

23. The organic electroluminescent element according to claim 15, wherein said dehydrating agent is contained in a porous casing; an adhesive provided in an end portion of said porous casing is used to fixedly bond said dehydrating agent to a surface of said upper layer of said composite protection film.

24. The organic electroluminescent element according to claim 18, wherein said barrier metallic film is constructed of an aluminum film or of aluminum alloy film.

25. The organic electroluminescent element according to claim 15, wherein a space defined and sealed by both said substrate and said sealing member is filled with an inert gas.

* * * * *